(12) United States Patent
Kong et al.

(10) Patent No.: US 10,079,579 B2
(45) Date of Patent: Sep. 18, 2018

(54) CIRCUIT FOR AMPLIFYING RADIO SIGNAL USING HIGH FREQUENCY

(71) Applicant: ELECTRONICS AND TELECOMMUNICATIONS RESEARCH INSTITUTE, Daejeon (KR)

(72) Inventors: Sunwoo Kong, Daejeon (KR); Bong Hyuk Park, Daejeon (KR); Moon-Sik Lee, Daejeon (KR); Hui Dong Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/487,905

(22) Filed: Apr. 14, 2017

(65) Prior Publication Data

US 2017/0302234 A1    Oct. 19, 2017

(30) Foreign Application Priority Data

Apr. 14, 2016    (KR) .................. 10-2016-0045743

(51) Int. Cl.
*H03F 3/191*    (2006.01)
*H03F 1/56*    (2006.01)
*H03F 3/195*    (2006.01)

(52) U.S. Cl.
CPC .............. *H03F 1/56* (2013.01); *H03F 3/195* (2013.01); *H03F 2200/318* (2013.01); *H03F 2200/391* (2013.01); *H03F 2200/451* (2013.01); *H03F 2200/534* (2013.01)

(58) Field of Classification Search
CPC ..... H03F 3/191; H03F 3/193; H03F 2200/534
USPC ......................................... 330/165, 188, 302
See application file for complete search history.

(56) References Cited

U.S. PATENT DOCUMENTS

| | | |
|---|---|---|
| 7,414,481 B2 * | 8/2008 | Li .......................... H03B 27/00 330/165 |
| 8,264,276 B2 | 9/2012 | Huang et al. |
| 2005/0134386 A1 * | 6/2005 | Westwick ................. H03F 3/21 330/301 |
| 2007/0290745 A1 | 12/2007 | Vitzilaios et al. |
| 2009/0160558 A1 | 6/2009 | Choi et al. |
| 2011/0128079 A1 | 6/2011 | Hwang et al. |
| 2013/0009704 A1 | 1/2013 | Liao |
| 2015/0123208 A1 | 5/2015 | Marbell et al. |

FOREIGN PATENT DOCUMENTS

| | | |
|---|---|---|
| KR | 10-0801570 B1 | 2/2008 |
| KR | 10-2011-0058053 A | 6/2011 |
| KR | 10-2014-0139277 A | 12/2014 |
| WO | 2007/026572 A1 | 3/2007 |

* cited by examiner

*Primary Examiner* — Steven J Mottola
(74) *Attorney, Agent, or Firm* — LRK Patent Law Firm

(57) ABSTRACT

A high frequency amplifier circuit includes a transistor including a drain, a gate, and a source, an inductance-capacitor (LC) tank connected to the drain, and a transformer connected to the gate and the source.

12 Claims, 6 Drawing Sheets g1: gate of M1 / g2: gate of M2
s1: gate of M1 / s2: gate of M2

CIRCUIT FOR AMPLIFYING RADIO SIGNAL USING HIGH FREQUENCY

CROSS-REFERENCE TO RELATED APPLICATION(S)

This application claims the priority benefit of Korean Patent Application No. 10-2016-0045743, filed on Apr. 14, 2016, in the Korean Intellectual Property Office, the disclosure of which is incorporated herein by reference for all purposes.

BACKGROUND

1. Field

One or more example embodiments relate to a wireless communication apparatus, and more particularly, to a high frequency amplifying circuit for reducing occurrence of oscillation.

2. Description of Related Art

A high frequency amplifier circuit may include a transistor and a resonance load. However, due to a feature of a radio frequency (RF) corresponding to a high frequency, a stability may be reduced by a feedback effect caused by a parasite element of the transistor.

To solve a problem that the stability is reduced, several methods are proposed. A method of increasing a degree of isolation between an input end and an inductance-capacitance (LC) tank, a method of applying an additional negative feedback, and a method of compensating for a feedback factor are proposed.

However, the method of increasing the degree of isolation may require that a supply voltage should be as high as an operating condition of an additional transistor because the additional transistor is disposed on top of an original transistor such that an amount of power consumption increases. In addition, a gain may be reduced due to a signal leakage caused by a parasitic element increasing at a connection point between transistors.

The method of applying the additional negative feedback may have a disadvantage that a gain is reduced. As a result, a plurality of amplifying operations is required such that the amount of power consumption may increase. Also, an additional inductor is required except for a matching circuit of an input end. An increased area of the inductor may reduce an economic efficiency.

The method of compensating for the feedback factor may remove such effect from a resonance frequency by using a feedback capacitor $C_F$ and a feedback inductor $L_F$ corresponding to a main factor that causes oscillation by reducing the stability. However, an operation bandwidth is relatively narrow because the method of compensating for the feedback factor is only performed at a resonance point of the feedback capacitor $C_F$ and the feedback inductor $L_F$. In addition, a size of the feedback inductor $L_F$ may increase based on a target frequency in order to compensate for a small size of the feedback capacitor $C_F$. When an integrated circuit (IC) is manufactured, it may be difficult to include an inductor in the IC and the economic efficiency may be reduced due to the increased area of the inductor.

SUMMARY

An aspect provides a method and apparatus for reducing occurrence of oscillation using a transformer and simultaneously enhancing a stability and performance of a high frequency amplifier circuit.

According to an aspect, there is provided a high frequency amplifier circuit including a transistor including a drain, a gate, and a source, an inductance-capacitance (LC) tank connected to the drain, and a transformer connected to the gate and the source.

The transformer may include a first transformer including a second inductor connected to the gate and a third inductor connected to an input end of the high frequency amplifier circuit, and a second transformer including the third inductor and a fourth inductor connected to the source, and the second inductor and the fourth inductor have opposite polarities.

One terminal of the second inductor may be connected to a reference voltage and another terminal of the second inductor may be connected to the gate.

One terminal of the third inductor may be connected to an input end of the high frequency amplifier circuit and another terminal of the third inductor may be connected to a ground.

One terminal of the fourth inductor may be connected to the source and another terminal of the fourth inductor may be connected to a ground.

The high frequency amplifier circuit may have a perpendicular structure including a first layer and a second layer, and the second inductor and the third inductor may be included in the first layer and the fourth inductor may be included in the second layer.

The LC tank may include a first inductor and a first capacitor.

According to another aspect, there is provided a high frequency amplifier circuit including a first transistor including a first drain, a first gate, and a first source, and a second transistor including a second drain, a second gate, and a second source, a first inductance-capacitance (LC) tank connected to the first drain and a first output end, and a second LC tank connected to the second drain and a second output end, and a first transformer and a second transformer connected to the first gate, the first source, a first input end, the second gate, the second source, or a second input end, wherein the first input end and the second input end are included in a differential input end.

The first LC tank may include a first inductor and a first capacitor, and the second LC tank may include a second inductor and a second capacitor.

The first transformer may include a third inductor connected to the first gate and the second gate and a fourth inductor connected to the first input end and the second input end, the second transformer may include the fourth inductor and a fifth inductor connected to the first source and the second source, and the third inductor and the fifth inductor may have opposite polarities.

The high frequency amplifier circuit may have a perpendicular structure including a first layer and a second layer, and the third inductor and the fourth inductor may be included in the first layer and the fifth inductor may be included in the second layer.

According to still another aspect, there is provided a matching circuit including a first transistor, and a high frequency amplifier circuit connected to a first drain of the first transistor, wherein the high frequency amplifier circuit includes a second transistor including a second drain, a gate, and a source, an inductance-capacitor (LC) tank connected to the second drain and an output end, and a first transformer and a second transformer connected to the gate, the source, or the first drain.

The first transformer may include a second inductor connected to the gate and a third inductor connected to the first drain, the second transformer may include the third inductor and a fourth inductor connected to the source, and the second inductor and the fourth inductor may have opposite polarities.

The third inductor may be connected to a supply voltage.

The third inductor and the fourth inductor may be connected to a bypass capacitor.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
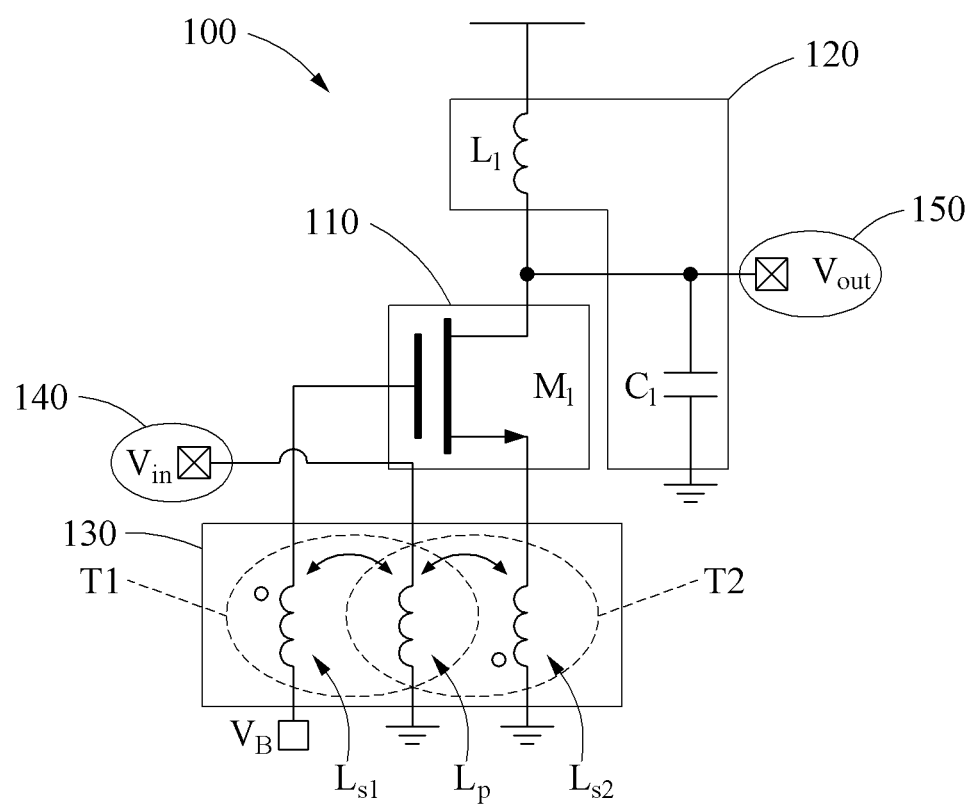
FIG. 1 is a diagram illustrating a high frequency amplifier circuit according to an example embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Terms such as first, second, A, B, (a), (b), and the like may be used herein to describe components. Each of these terminologies is not used to define an essence, order or sequence of a corresponding component but used merely to distinguish the corresponding component from other component(s). For example, a first component may be referred to a second component, and similarly the second component may also be referred to as the first component.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, examples are described in detail with reference to the accompanying drawings. Like reference numerals in the drawings denote like elements, and a known function or configuration will be omitted herein.

FIG. 1 is a diagram illustrating a high frequency amplifier circuit according to an example embodiment.

In an example, the high frequency amplifier circuit may operate at a high frequency to transmit a radio signal by amplifying the radio signal or amplify a received radio signal. In detail, the high frequency amplifier circuit may apply an input signal to an input end of the high frequency amplifier circuit. The input signal may be applied to a gate of a transistor and a resonance point of an inductance-capacitance (LC) tank connected to a drain of the transistor is matched to a high frequency signal such that an amplification gain may be obtained.

In this example, a stability of the high frequency amplifier circuit may be reduced by a feedback effect caused by a parasitic element of the transistor due to a high frequency. Thus, an oscillation phenomenon in which an output signal occurs may be caused even when an input signal is absent due to the feedback effect. The high frequency amplifier circuit may enhance the stability using a transformer disposed between the input end and the gate.

The high frequency amplifier circuit may operate at the high frequency to simultaneously achieve the stability and high performance. Here, the high performance may indicate good performance in an input/output matching feature, a noise feature, a gain, an output power, a linearity, and an amount of power consumption. The stability may indicate a degree of reducing the oscillation phenomenon.

In an example, a high frequency amplifier circuit 100 includes a transistor 110, hereinafter also referred to as a transistor $M_1$, an LC tank 120, and a transformer 130.

The high frequency amplifier circuit 100 may apply an input signal to an input end 140 of the high frequency amplifier circuit 100. The LC tank 120 may be connected to a drain of the transistor 110 to match a resonance point to a high frequency signal. The transistor 110 may obtain an amplification gain using the input signal applied to the gate and the resonance point formed by the LC tank 120. The transformer 130 may be connected between the gate and a source such that a stability of the high frequency amplifier circuit 100 is enhanced.

The transistor 110 includes a drain, a gate, and a source. For example, the transistor 110 includes a metal oxide semiconductor field effect transistor (MOSFET). The LC tank 120 may be connected to the drain. The LC tank 120 may include a first inductor $L_1$ and a first capacitor $C_1$ to form a resonance load. The first inductor $L_1$, the first capacitor $C_1$, and the drain may be connected to an output end 150. The transformer 130 may be connected to the gate and the source.

The transformer 130 includes a first transformer T1 including a second inductor $L_{s1}$ connected to the gate and a third inductor $L_p$ connected to the input end 140 of the high frequency amplifier circuit 100. The second inductor $L_{s1}$ and the third inductor $L_p$ may be coupled by a mutual inductance. The transformer 130 may include a second transformer T2 including the third inductor $L_p$ and a fourth inductor $L_{s2}$ connected to the source. The third inductor $L_p$ and the fourth inductor $L_{s2}$ may be coupled by the mutual inductance. The second inductor $L_{s1}$ and the fourth inductor $L_{s2}$ may have opposite polarities.

The fourth inductor $L_{s2}$ may be connected to the source of the transistor 110 to apply a negative feedback to the transistor 110. Thus, the stability may be enhanced such that a probability that oscillation occurs may be reduced. It may indicate that a real value of an input impedance is a positive value.

The third inductor $L_p$ connected to the input end 140 may form two transformers simultaneously. Thus, the first transformer T1 and the second transformer T2 are formed. The first transformer T1 may include the third inductor $L_p$ and the second inductor $L_{s1}$. The second transformer T2 may include the third inductor $L_p$ and the fourth inductor $L_{s2}$. The third inductor $L_p$ and the second inductor $L_{s1}$ may have a mutual inductance, and the third inductor $L_p$ and the fourth inductor $L_{s2}$ may have a mutual inductance.

Here, the fourth inductor $L_{s2}$ and the second inductor $L_{s1}$ connected to the third inductor $L_p$ may have opposite polarities. Thus, a phase of a signal of the gate coupled to the third inductor $L_p$ being a first side of the first transformer T1 and connected to the second inductor $L_{s1}$ being a second side of the first transformer T1 may differ, by 180 degrees, from a phase of a signal of the source coupled to the third inductor $L_T$ being a first side of the second transformer T2 and connected to the fourth inductor $L_{s2}$ being a second side of the second transformer T2.

An amplitude of a valid signal between the gate and the source of the transistor 110 may increase due to an amplitude difference caused by a difference between the phases. Thus, the high frequency amplifier circuit 100 may increase a gain using a manual element only without consuming additional power. The high frequency amplifier circuit 100 may obtain a maximum gain from the phase difference of 180 degrees, and the amplitude of the valid signal between the gate and the source of the transistor 110 may decrease as the phase difference differs from a value during one cycle.

Figure 2:
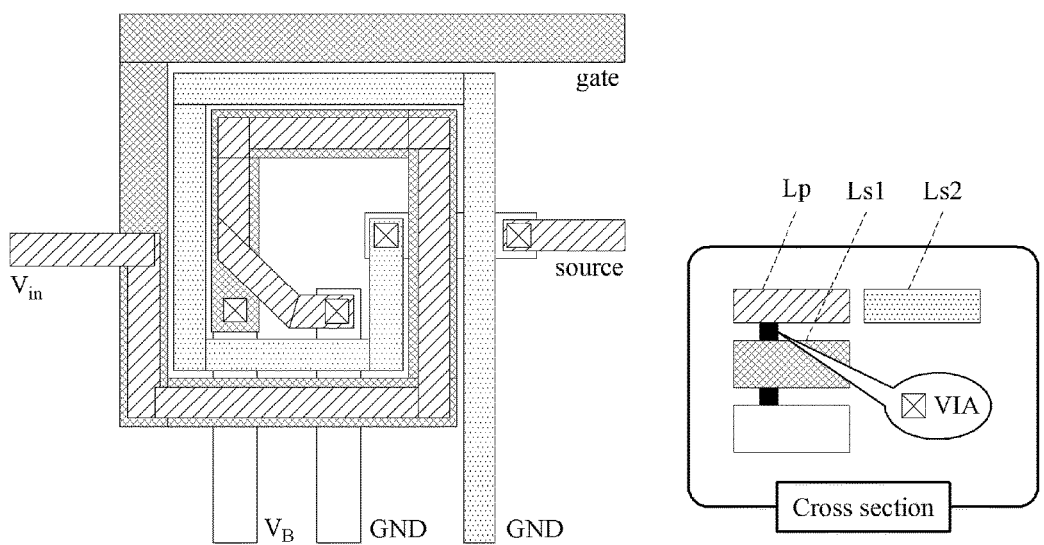
FIG. 2 is a diagram illustrating a perpendicular structure of a high frequency amplifier circuit according to an example embodiment.

FIG. 2 is a diagram illustrating a perpendicular structure of a high frequency amplifier circuit according to an example embodiment.

FIG. 2 is a top view and a cross-sectional view of the transformer 130. A planar inductor may be implemented by twisting a metal line in an integrated circuit (IC) manufacturing process. The transformer 130 may be provided by laterally disposing inductors on a same layer, or disposing the inductors on or below different layers.

In an example, the transformer 130 has a perpendicular structure including a first layer and a second layer. A second inductor $L_{s1}$ and a third inductor $L_p$ may be included in the first layer. A fourth layer $L_{s2}$ may be included in the second layer. Thus, the second inductor $L_{s1}$ and the third inductor $L_p$ may be included in a layer differing from a layer in which the fourth layer $L_{s2}$ is included.

In detail, the third inductor $L_p$ and the second inductor $L_{s1}$ of FIG. 2 are disposed on a same layer in FIG. 2 such that an edge side coupling may be used. The third inductor $L_p$ and the fourth inductor $L_{s2}$ of FIG. 2 are disposed on different layers such that a broad side coupling may be used. Here, the second inductor $L_{s1}$ and the fourth inductor $L_{s2}$ may be disposed to minimize an effect of the edge side coupling and an effect of the broad side coupling.

Figure 3:
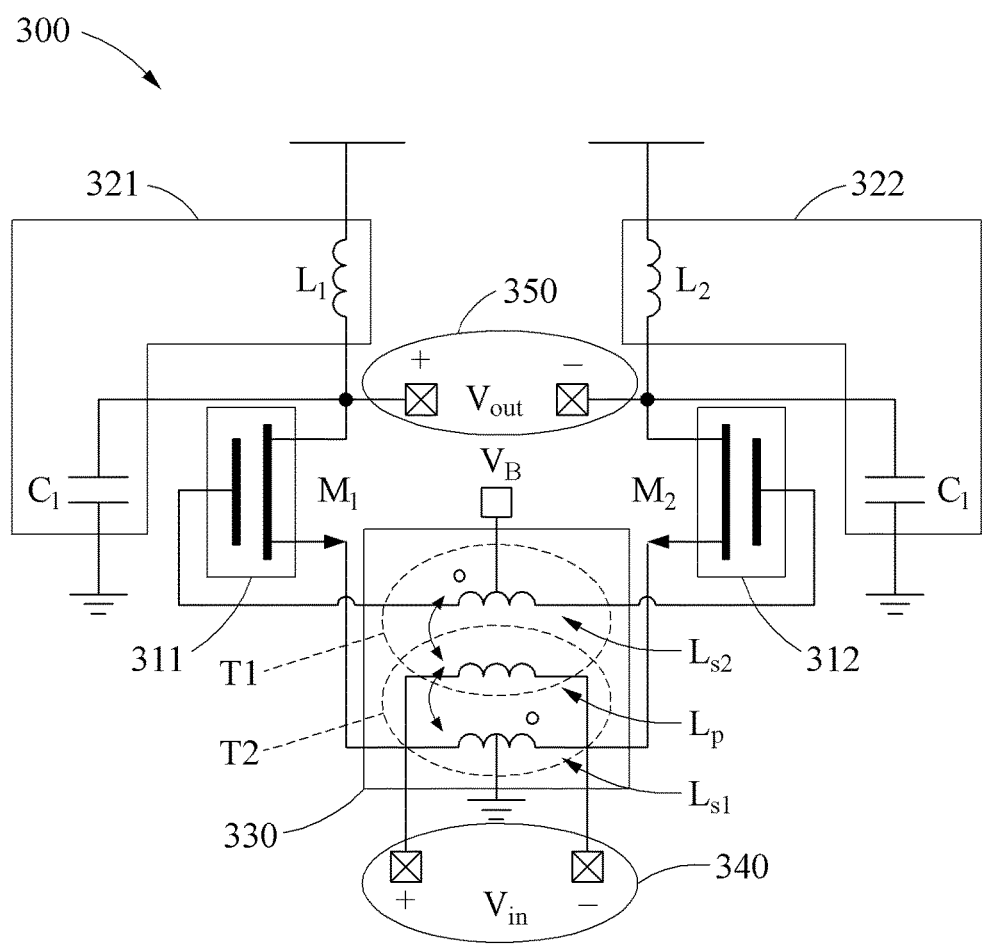
FIG. 3 is a diagram illustrating a high frequency amplifier circuit configuration applied to a differential amplifier circuit according to an example embodiment.

FIG. 3 is a diagram illustrating a high frequency amplifier circuit configuration applied to a differential amplifier circuit according to an example embodiment.

In an example, a high frequency amplifier circuit 300 has a symmetrical structure of the high frequency amplifier circuit 100 of FIG. 1. Through this, the high frequency amplifier circuit 300 may achieve a high stability and performance by removing a common mode portion of an input signal while amplifying a differential mode portion.

A first transformer T1 includes a fourth inductor $L_p$ and a third inductor $L_{s1}$. A second transformer T2 includes a fourth inductor $L_p$ and a fifth inductor $L_{s2}$. The high frequency amplifier circuit 300 is in a form of a differential amplifier circuit, and a negative terminal (second input end) and a positive terminal (first input end) instead of a ground terminal of a single amplifier circuit may perform a role of the single amplifier circuit. The fourth inductor $L_p$ and the third inductor $L_{s1}$ may form a mutual inductance, and the fourth inductor $L_p$ and the fifth inductor $L_{s2}$ may form a mutual inductance. Here, the fifth inductor $L_{s2}$ and the third inductor $L_{s1}$ connected to the fourth inductor $L_p$ may have opposite polarities.

The high frequency amplifier circuit 300 includes a first transistor 311, a second transistor 312, a first LC tank 321, a second LC tank 322, a transformer 330, a differential input end 340, and an output end 350. The differential input end 340 includes a first input end and a second input end. The output end 350 includes a first output end and a second output end.

The first transistor 311 includes a first drain, a first gate, and a first source, and the second transistor 312 includes a second drain, a second gate, and a second source.

The first LC tank 321 may be connected to the first drain and the first output end. The second LC tank 322 may be connected to the second drain and the second output end. The first LC tank 321 includes a first inductor $L_1$ and a first capacitor $C_1$, and the second LC tank 322 includes a second inductor $L_2$ and a second capacitor $C_2$.

The transformer 330 includes the first transformer T1 and the second transformer T2. The first transformer T1 and the second transformer T2 may be connected to the first gate, the first source, the first input end, the second gate, the second source, or the second input end. In detail, the first transformer T1 includes the third inductor $L_{s1}$ connected to the first gate and the second gate, and the fourth inductor $L_p$ connected to the first input end and the second input end. The second transformer T2 includes the fourth inductor $L_p$ and the fifth inductor $L_{s2}$ connected to the first source and the second source. Here, the third inductor $L_{s1}$ and the fifth inductor $L_{s2}$ may have opposite polarities.

Figure 4:
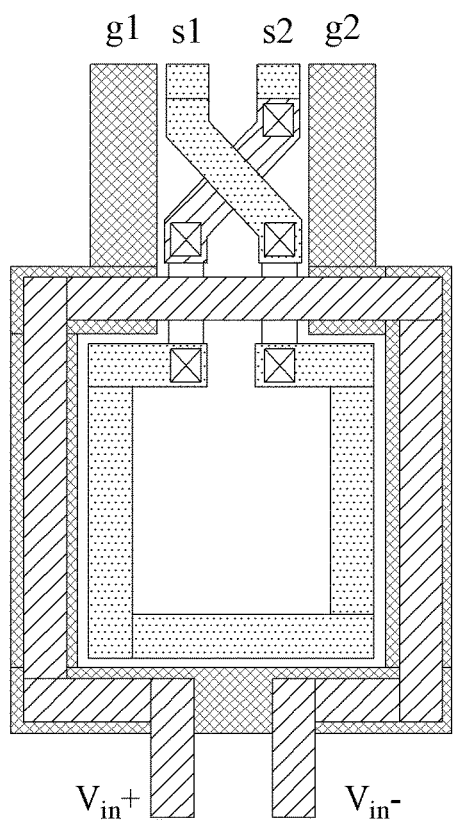
FIG. 4 is a diagram illustrating a perpendicular structure of a high amplifier circuit applied to a differential amplifier circuit according to an example embodiment.
Figure 4:
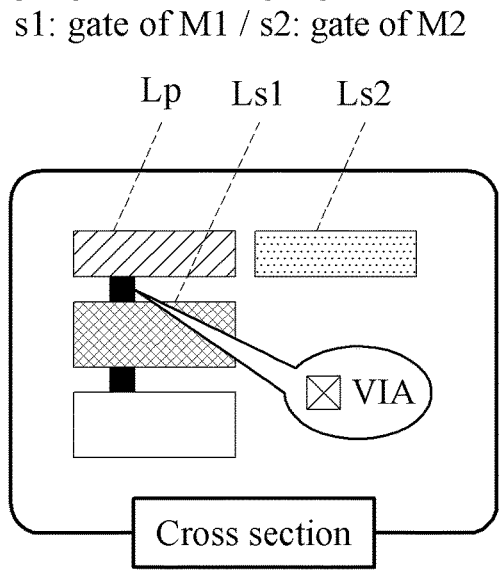

FIG. 4 is a diagram illustrating a perpendicular structure of a high amplifier circuit applied to a differential amplifier circuit according to an example embodiment.

FIG. 4 is a top view and a cross-sectional view of the transformer 330. A planar inductor may be implemented by twisting a metal line in an integrated circuit (IC) manufacturing process. The transformer 330 may be provided by laterally disposing inductors on a same layer, or disposing the inductors on or below different layers. Such description is identical to the description provided with reference to FIG. 2. However, a symmetrical layout may be used to apply a structure of the transformer 330 to a structure of the differential amplifier circuit.

In an example, the transformer 330 has a perpendicular structure including a first layer and a second layer. A third inductor $L_{s1}$ and a fourth inductor $L_p$ are included in the first layer, and a fifth inductor $L_{s2}$ is included in the second layer. Thus, the third inductor $L_{s1}$ and the fourth inductor $L_p$ may be included in a layer differing from a layer in which the fifth layer $L_{s2}$ is included.

In detail, the third inductor $L_{s1}$ and the fourth inductor $L_p$ of FIG. 3 are disposed on a same layer in FIG. 4 such that an edge side coupling may be used. The fourth inductor $L_p$ and the fifth inductor $L_{s2}$ of FIG. 3 are disposed on different layers such that a broad side coupling may be used. Here, the third inductor $L_{s1}$ and the fifth inductor $L_{s2}$ may be disposed to minimize an effect of the edge side coupling and an effect of the broad side coupling.

Figure 5A:
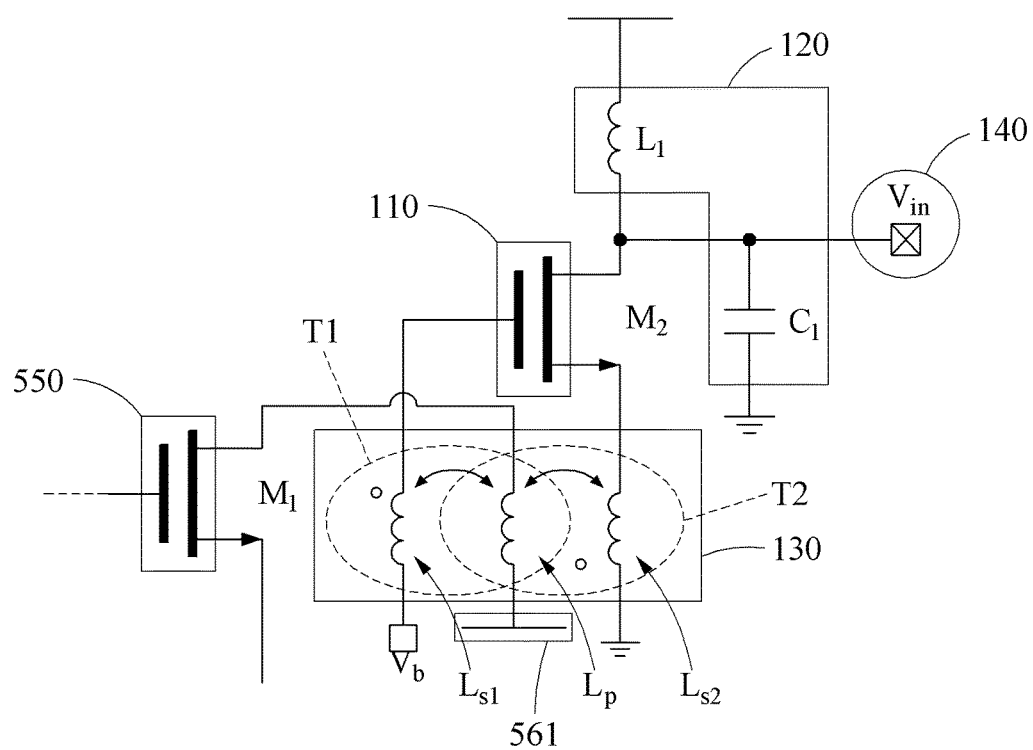
FIG. 5A is a diagram illustrating a high frequency amplifier circuit applied to a matching circuit according to an example embodiment.
Figure 5B:
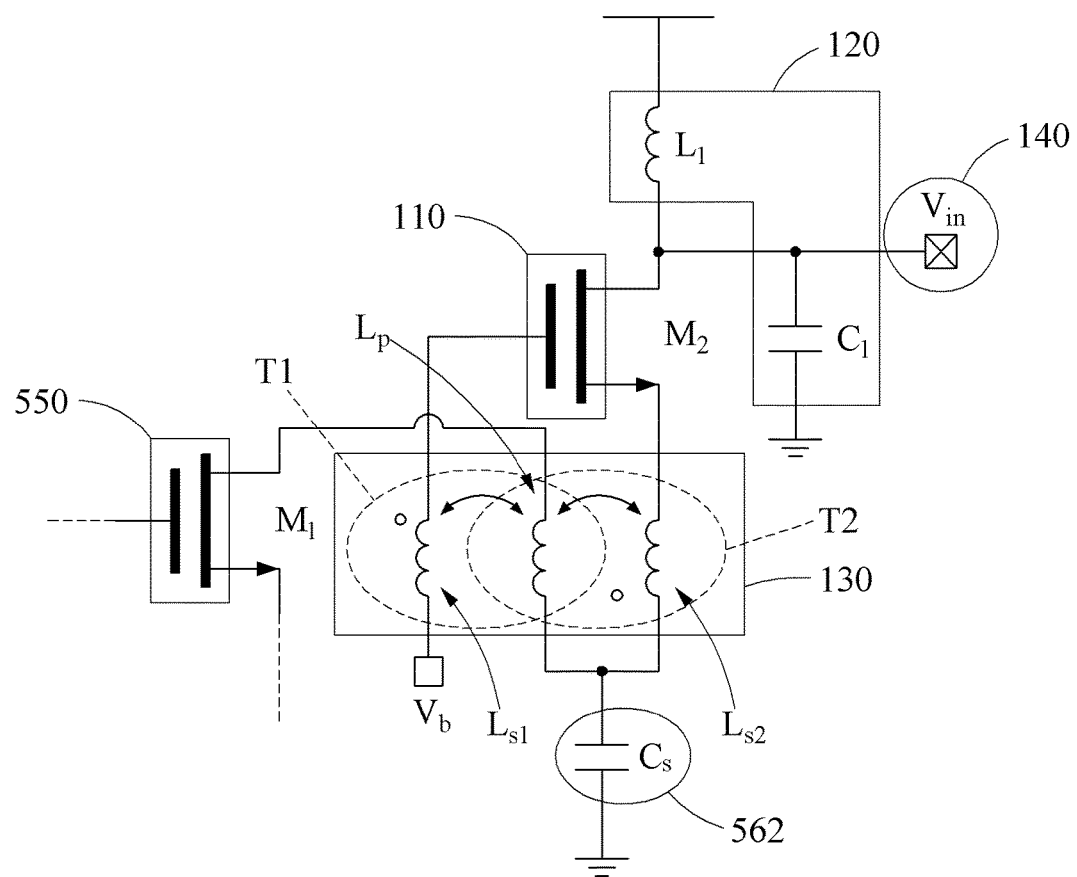
FIG. 5B is a diagram illustrating a high frequency amplifier circuit applied to a matching circuit according to another example embodiment.

FIG. 5A is a diagram illustrating a high frequency amplifier circuit applied to a matching circuit according to an example embodiment, and FIG. 5B is a diagram illustrating a high frequency amplifier circuit applied to a matching circuit according to another example embodiment.

In an example, a high frequency amplifier circuit may be used as an inter stage matching circuit. FIGS. 5A and 5B illustrate two examples in which the high frequency amplifier circuit is used as the inter stage matching circuit.

When a transformer including a second inductor $L_{s1}$ and a fourth inductor $L_{s2}$ is used, current conversion or voltage conversion of a first side and a second side may be adjusted such that a signal of a first transistor 550 may be effectively transferred to the second transistor 110, hereinafter also referred to as a second transistor M2. In a structure of a general common source, oscillation caused by a radio frequency (RF) of an inductor load connected to a drain of a transistor may be reduced by controlling a first transformer T1 or a second transformer T2. An area of each of a third inductor $L_p$, a second inductor $L_{s1}$, and a fourth inductor $L_{s2}$ may not greatly increase compared to a size of a single inductor because the third inductor $L_p$, the second inductor $L_{s1}$, and the fourth inductor $L_{s2}$ are provided in an overlapping structure.

The inter stage matching circuit may include the high frequency amplifier circuit connected to a first drain of the first transistor 550. The high frequency amplifier circuit includes the second transistor 110 including a second drain, a second gate, and a second source, and the LC tank 120 connected to the second drain and the output end 140.

The high frequency amplifier circuit includes the first transformer T1 and the second transformer T2 connected to the source, the gate of the first transistor 550, or a first drain of the second transistor 110. In detail, the first transformer T1 includes the second inductor $L_{s1}$ connected to the gate and the third inductor $L_p$ connected to the first drain. The second transformer T2 includes the third inductor $L_p$ and the fourth inductor $L_{s2}$ connected to the source. Here, the second inductor $L_{s1}$ and the fourth inductor $L_{s2}$ may have opposite polarities.

The third inductor $L_p$ may be connected to the first drain of the first transistor 550 included in a first end to perform a role of a load of the first transistor 550. Simultaneously, the third inductor $L_p$ may perform a role of the first transformer T1 and the second transformer T2 provided with the second inductor $L_{s1}$ and the fourth inductor $L_{s2}$ such that a signal from the first transistor 550 to a second end including the second transistor 110.

In an example, the third inductor $L_p$ of the inter stage matching circuit of FIG. 5A may be connected to a supply voltage. In detail, a terminal of the third inductor $L_p$ may be connected to a supply voltage VDD 561, and the first transistor 550 and the second transistor 110 may have distinguished current paths. Referring to FIG. 5A, a matching circuit may consume a great amount of power but there is a sufficient space for swinging a voltage whereby having a relatively great linearity.

In another example, referring to FIG. 5B, the third inductor $L_p$ and the fourth inductor $L_{s2}$ of the inter stage matching circuit may be connected to a bypass capacitor 562, hereinafter also referred to as a bypass capacitor $C_s$. In detail, one terminal of the third inductor $L_p$ may be connected to the fourth inductor $L_{s2}$. A current used by the second transistor 110 may be reused by the first transistor 550 when a connected portion is reconnected to the bypass capacitor 562.

According to an example embodiment, it is possible to reduce occurrence of oscillation using a transformer and simultaneously enhance a stability and performance of a high frequency amplifier circuit.

The components described in the exemplary embodiments of the present invention may be achieved by hardware components including at least one DSP (Digital Signal Processor), a processor, a controller, an ASIC (Application Specific Integrated Circuit), a programmable logic element such as an FPGA (Field Programmable Gate Array), other electronic devices, and combinations thereof. At least some of the functions or the processes described in the exemplary embodiments of the present invention may be achieved by software, and the software may be recorded on a recording medium. The components, the functions, and the processes described in the exemplary embodiments of the present invention may be achieved by a combination of hardware and software.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A high frequency amplifier circuit comprising:
a transistor including a drain, a gate, and a source;
an inductance-capacitance (LC) tank connected to the drain; and
a transformer connected to the gate and the source, wherein the transformer includes:
a first transformer including a second inductor connected to the gate, and a third inductor connected to an input end of the high frequency amplifier circuit; and
a second transformer including the third inductor and a fourth inductor connected to the source, and
wherein the second inductor and the fourth inductor have opposite polarities.

2. The high frequency amplifier circuit of claim 1, wherein one terminal of the second inductor is connected to a reference voltage and another terminal of the second inductor is connected to the gate.

3. The high frequency amplifier circuit of claim 1, wherein one terminal of the third inductor is connected to an input end of the high frequency amplifier circuit and another terminal of the third inductor is connected to a ground.

4. The high frequency amplifier circuit of claim 1, wherein one terminal of the fourth inductor is connected to the source and another terminal of the fourth inductor is connected to a ground.

5. The high frequency amplifier circuit of claim 1, wherein:
the high frequency amplifier circuit has a perpendicular structure including a first layer and a second layer, and
the second inductor and the third inductor are included in the first layer and the fourth inductor is included in the second layer.

6. The high frequency amplifier circuit of claim 1, wherein the LC tank includes a first inductor and a first capacitor.

7. A high frequency amplifier circuit comprising:
a first transistor including a first drain, a first gate, and a first source, and a second transistor including a second drain, a second gate, and a second source;
a first inductance-capacitance (LC) tank connected to the first drain and a first output end, and a second LC tank connected to the second drain and a second output end; and
a first transformer and a second transformer connected to the first gate, the first source, a first input end, the second gate, the second source, and a second input end,
wherein the first input end and the second input end are included in a differential input end,
wherein the first transformer includes a third inductor connected to the first gate and the second gate, and a fourth inductor connected to the first input end and the second input end,
wherein the second transformer includes the fourth inductor and a fifth inductor connected to the first source and the second source, and
wherein the third inductor and the fifth inductor have opposite polarities.

8. The high frequency amplifier circuit of claim 7, wherein the first LC tank includes a first inductor and a first capacitor, and the second LC tank includes a second inductor and a second capacitor.

9. The high frequency amplifier circuit of claim 7, wherein:
the high frequency amplifier circuit has a perpendicular structure including a first layer and a second layer, and
the third inductor and the fourth inductor are included in the first layer and the fifth inductor is included in the second layer.

10. A matching circuit comprising:
a first transistor; and
a high frequency amplifier circuit connected to a first drain of the first transistor,
wherein the high frequency amplifier circuit includes:
a second transistor including a second drain, a gate, and a source;
an inductance-capacitor (LC) tank connected to the second drain and an output end; and
a first transformer and a second transformer connected to the gate, the source, and the first drain,
wherein the first transformer includes a second inductor connected to the gate, and a third inductor connected to the first drain,
wherein the second transformer includes the third inductor and a fourth inductor connected to the source, and
wherein the second inductor and the fourth inductor have opposite polarities.

11. The matching circuit of claim 10, wherein the third inductor is connected to a supply voltage.

12. The matching circuit of claim 10, wherein the third inductor and the fourth inductor are connected to a bypass capacitor.

* * * * *